(12) United States Patent
Farooq et al.

(10) Patent No.: US 8,455,270 B2
(45) Date of Patent: Jun. 4, 2013

(54) 3D MULTIPLE DIE STACKING

(75) Inventors: Mukta G. Farooq, Hopewell Junction, NY (US); Robert Hannon, Wappingers Falls, NY (US); Subramanian S. Iyer, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 921 days.

(21) Appl. No.: 12/561,618

(22) Filed: Sep. 17, 2009

(65) Prior Publication Data

US 2011/0065214 A1    Mar. 17, 2011

(51) Int. Cl.
*G01R 31/26* (2006.01)
*H01L 21/66* (2006.01)

(52) U.S. Cl.
USPC ............... 438/17; 438/14; 438/15; 438/16; 438/18

(58) Field of Classification Search
USPC ..................................................... 438/14–18
See application file for complete search history.

(56) References Cited

U.S. PATENT DOCUMENTS

| | | | | |
|---|---|---|---|---|
| 5,656,553 | A * | 8/1997 | Leas et al. | 438/15 |
| 7,754,532 | B2 * | 7/2010 | Farrar | 438/113 |
| 7,863,918 | B2 * | 1/2011 | Jenkins et al. | 324/750.3 |
| 2007/0080448 | A1 * | 4/2007 | DeMulder et al. | 257/723 |

* cited by examiner

*Primary Examiner* — Bac Au
(74) *Attorney, Agent, or Firm* — Catherine Ivers; Ira D. Blecker

(57) ABSTRACT

A process of forming three-dimensional (3D) die. A plurality of wafers are tested for die that pass (good die) or fail (bad die) predetermined test criteria. Two tested wafers are placed in proximity to each other. The wafers are aligned in such a manner so as to maximize the number of good die aligned between the two wafers. The two wafers are then bonded together and diced into individual stacks of bonded good die.

16 Claims, 4 Drawing Sheets

3D MULTIPLE DIE STACKING

BACKGROUND OF THE INVENTION

The present invention relates to the stacking of multiple wafers to form three-dimensional (3D) semiconductor die structures and, more particularly, relates to the alignment of stacked multiple wafers prior to bonding of the wafers in order to maximize the number of good 3D semiconductor die structures.

Three-dimensional wafer-to-wafer vertical stack technology seeks to achieve the vertical stacking of many layers of active integrated circuit devices such as processors, programmable devices and memory devices inside a single 3D chip to shorten average wire lengths, thereby reducing interconnect RC delay and increasing system performance.

In the current process for 3D integration, at least two wafers are placed on each other and then bonded to create a multi-wafer stack. The final stack is then diced into individual die-sized cuboids.

BRIEF SUMMARY OF THE INVENTION

The various advantages and purposes of the present invention as described above and hereafter are achieved by providing, according to a first aspect of the invention, a process of forming 3D die which includes testing a plurality of wafers by a testing apparatus for die that pass (good die) or fail (bad die) predetermined test criteria; placing a first tested wafer in proximity to a second tested wafer; aligning in a wafer stacking apparatus the first and second wafers so as to maximize the number of good die of the first wafer aligned with good die of the second wafer; bonding the first and second wafers; and dicing the stack of first and second wafers into 3D stacks of good die bonded to good die.

According to a second aspect of the invention, there is provided a computer program product for forming 3D die, the computer program product which includes: a computer readable storage medium having computer readable program code embodied therewith, the computer readable program code which includes: computer readable program code configured to test a plurality of wafers for die that pass (good die) or fail (bad die) predetermined test criteria; computer readable program code configured to place a first tested wafer in proximity to a second tested wafer; computer readable program code configured to align the first and second wafers so as to maximize the number of good die of the first wafer aligned with good die of the second wafer; computer readable program code configured to bond the first and second wafers; and computer readable program code configured to dice the stack of first and second wafers into 3D stacks of good die bonded to good die.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

It is noted by the present inventors that each wafer will have some good die and some bad die. In a single wafer build according to conventional processing, bad die may be scrapped based on results (and mapping) after testing and/or inspection. Bad die may have mechanical or electrical defects which make them unsuitable for use in product. Only good die may be used for product.

The foregoing methodology works well when only a single wafer is used since good die may be separated from bad die with only the good die being used. This methodology may not work as well when multiple wafers are stacked to make the final product since a bad die in one wafer joined to a good die in another wafer renders the entire stack of joined die bad.

The present invention is directed to a process of aligning and stacking wafers that take into account test and inspection data from wafer level test and inspection and then stack the wafers in a manner that maximizes the final yield of good die stacked on good die.

Figure 1:
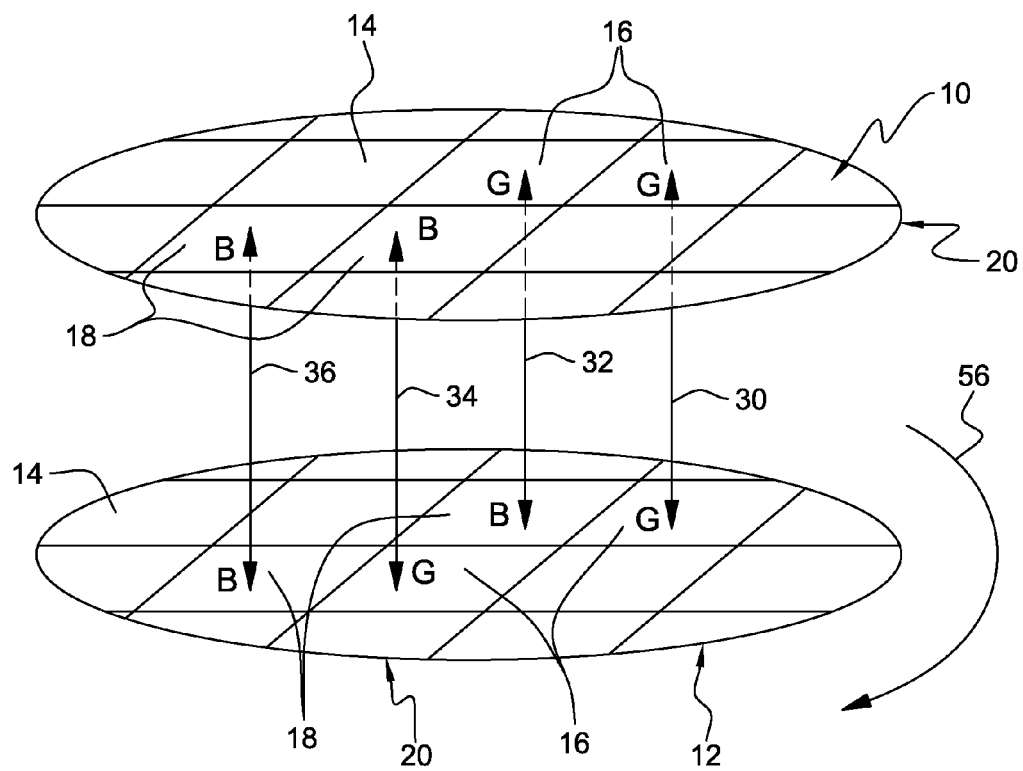
FIG. 1 is a pictorial representation of two wafers in alignment with one wafer rotated with respect to the other wafer.

Referring to the Figures in more detail, and particularly referring to FIG. 1, there is shown two wafers 10, 12 each of which comprises a plurality of semiconductor chips or die 14. Die, chip and semiconductor chip may be used interchangeably herein. The die 14 on each wafer 10, 12 have been tested and inspected so that it is known that some of the die 14 are "good" meaning that they have passed predetermined criteria of testing and inspection and some of the die 14 are "bad" meaning that they have failed predetermined criteria of testing and inspection. The known good die are indicated by reference number 16 and the letter "G" while the known bad die are indicated by reference number 18 and the letter "B".

Each of the wafers 10, 12 has a notch 20 which is used to align the wafers 10, 12 for stacking in a conventional wafer stacking apparatus. The present inventors have realized, however, that the best fit between wafers to obtain the most good die-to-good die combinations may not occur when the wafers 10, 12 are simply aligned notch to notch.

Accordingly, the present inventors have proposed a preferred embodiment of the present invention for aligning the wafers 10, 12 to obtain the highest number of good die-to-good die combinations.

Figure 2:
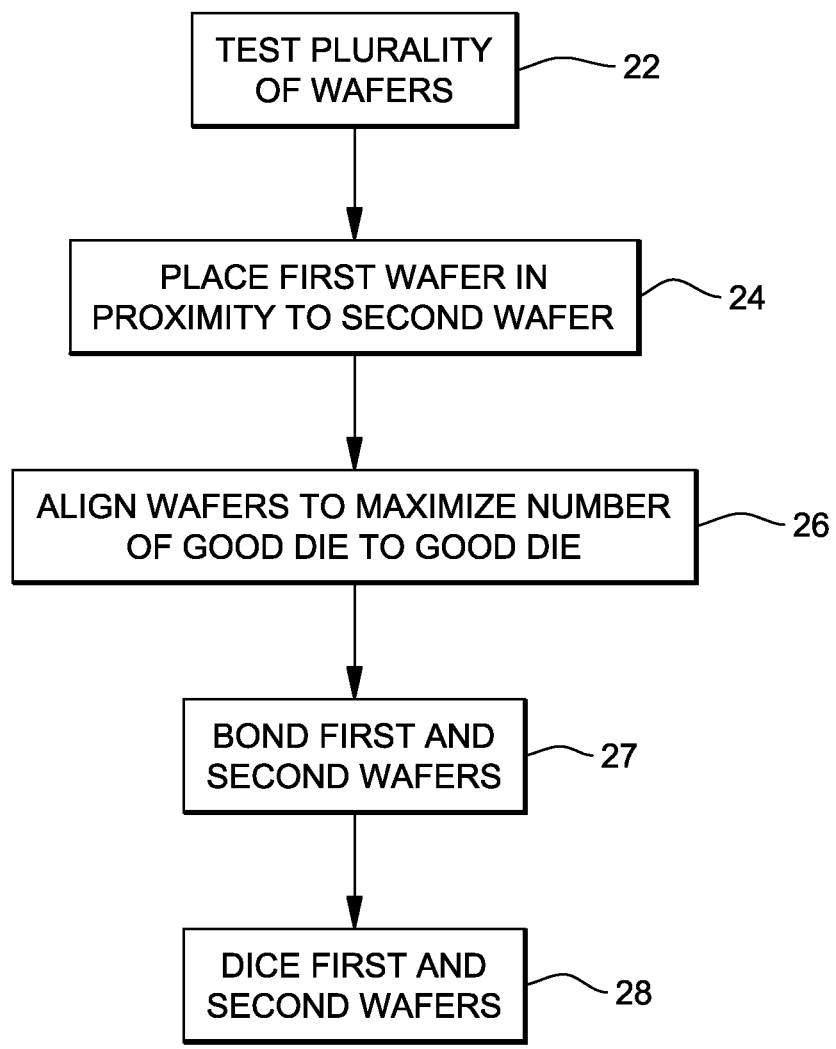
FIGS. 2 and 3 are flow charts illustrating a method according to an embodiment of the present invention.

Referring to FIGS. 1 and 2 together, the preferred embodiment of the method of the present invention will now be discussed. As indicated above, the wafers 10, 12 may be tested and inspected by conventional testing and inspection apparatus, block 22 of FIG. 2, to determine which die are good and which die are bad. The wafers 10, 12 may also be mapped so that the good and bad die can be accurately located on the wafers 10, 12. "Test" or "testing" when used herein refers to testing (for example, electrical testing), inspecting and/or mapping which may be done as is customary in the manufacturing of die.

Then, the wafers 10, 12 may be placed in proximity to each other in the wafer stacking apparatus either by an operator or by an automated tool after the testing and inspection apparatus, block 24 in FIG. 2, and as also shown in FIG. 1.

Thereafter, the wafers 10, 12 may be aligned by the wafer stacking apparatus so as to maximize the number of good die of wafer 10 aligned with good die of wafer 12, block 26 FIG. 2. The process for aligning the wafers so as to maximize the number of good die-to-good die combinations will be discussed shortly. Referring to FIG. 1, it is desirable to maximize the number of good die-to-good die combinations as indicated by double-ended arrow 30. It is also desirable to minimize the number of good die-to-bad die combinations as indicated by double-ended arrows 32, 34 as these result in the wasting of good die. In a preferred embodiment of the present invention, it is preferred to also maximize the number of bad die-to-bad die combinations as indicated by double-ended arrows 36.

The process of aligning of the wafers 10, 12 is repeated a number of times by the wafer stacking apparatus until all wafers have been aligned. As shown in FIG. 1, there are only two wafers 10, 12 shown. If the proposed wafer stack has three wafers, then a third wafer (not shown) would be aligned to a previous wafer, either wafer 10 or wafer 12. If a fourth wafer (not shown) was to be added to the wafer stack, then the fourth wafer would be aligned to a previous wafer, for example the third wafer. The process would continue until all wafers have been processed by aligning so as to maximize the number of good die-to-good die combinations.

After aligning of the wafers 10, 12 (as well as any additional wafers) so as to maximize the number of good die-to-good die combinations, the next step in the process is bonding the wafers 10, 12 (and any additional wafers) together, block 27, to form a stack of bonded wafers. The wafers may be bonded together by conventional means. In one embodiment of the present invention, the aligned wafers 10, 12 may be removed from the wafer stacking apparatus and, for example, transported to an oven or furnace, while being held in alignment by an apparatus, for reflowing of solder to bond the wafers 10, 12 together.

Lastly, the process ends by dicing the stacked wafers 10, 12 (and any additional wafers) into 3D stacks of multiple die, block 28. The dicing may be done by a conventional dicing apparatus.

Figure 3:
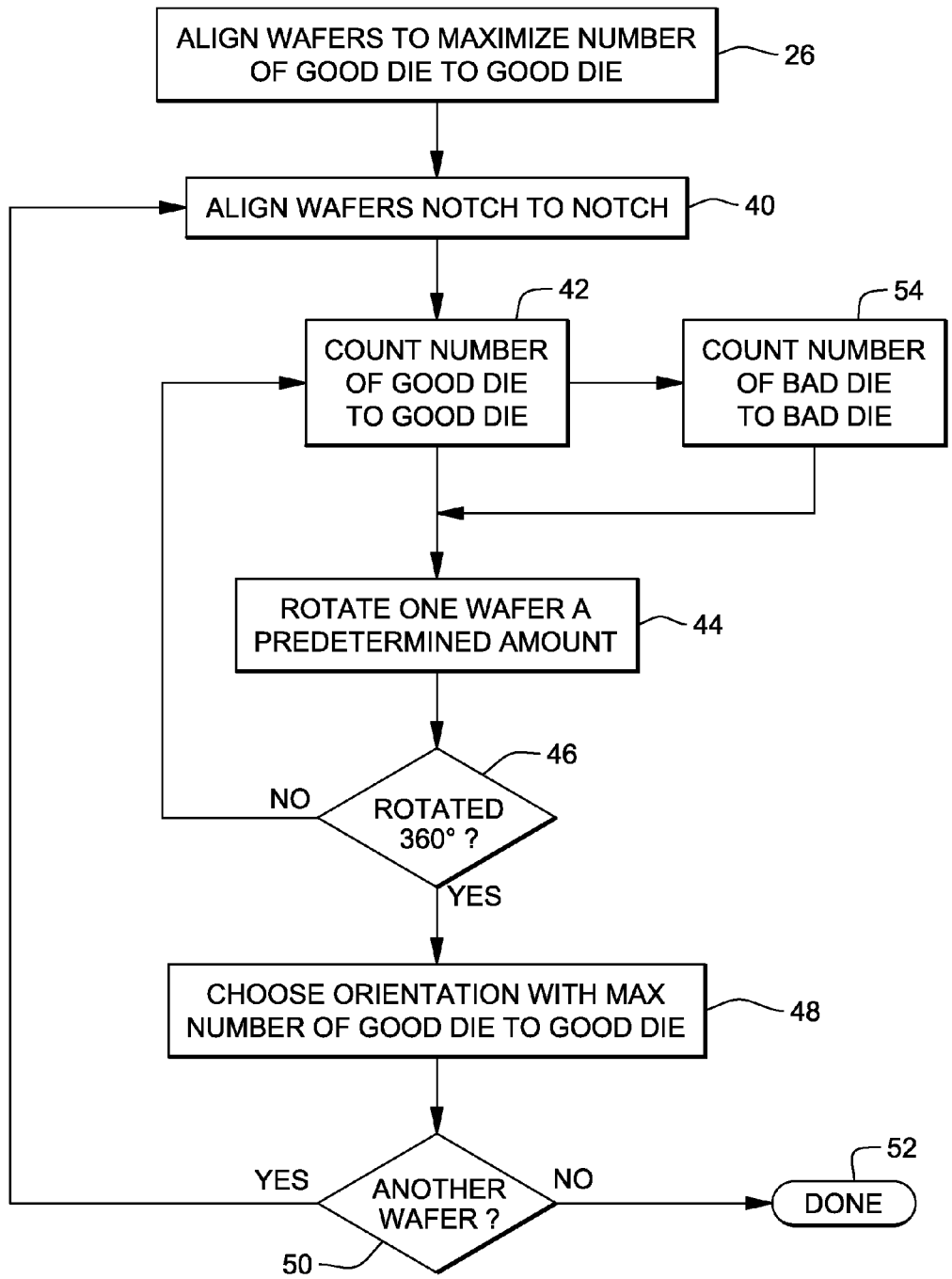

Referring now to FIG. 3, the process of aligning wafers to maximize the number of good die-to-good die combinations, block 26, will be discussed. In a preferred embodiment of the present invention, the process begins by aligning the wafers 10, 12 notch to notch, block 40, in the wafer stacking apparatus. The process of aligning the wafers 10, 12 is most efficiently accomplished by a computer software program (hereafter the "Alignment Program") in which the various steps of the process have been programmed.

In block 42, the Alignment Program counts the number of good die-to-good die combinations while the wafers 10, 12 are aligned notch to notch. This would be those die combinations indicated by double-ended arrows 30 in FIG. 1. In a preferred embodiment of the present invention, the Alignment Program may additionally count the number of bad die-to-bad die combinations, block 54.

In block 44, the wafers 10 or 12 are rotated a predetermined amount in the wafer stacking apparatus according to instructions from the Alignment Program. Referring to FIG. 1, it can be seen that wafer 12 has been rotated 56 by 90 degrees. Note the position of notch 20 of wafer 10 with respect to notch 20 of wafer 12. For square die, the preferred angle of rotation will be 90 degrees. The angle of rotation could be more or less than 90 degrees depending on the geometry of the die in the wafers 10, 12. That is, to facilitate one wafer being rotated with respect to another wafer, the die on the wafers may have design symmetry such that the input/output connections on the opposing die will still be in alignment even after the rotation. For square die, the design symmetry may be 90 degrees while for rectangular die, the design symmetry may be 180 degrees. Other shapes of die may lead to other design symmetries.

If the cumulative angle of rotation is not 360 degrees, block 46, meaning that there has not been a complete rotation of the wafer 12 in the wafer stacking apparatus during which the counting of the number of good die-to-good combinations has occurred, the process repeats wherein the Alignment Program counts the number of good die-to-good die combinations, block 42, and then rotates the wafer 12 in the wafer stacking apparatus by a predetermined amount, block 44. The process continues to repeat until it is determined by the Alignment Program, block 46, that the wafer has been rotated 360 degrees so that every possible orientation has been considered for the alignment of the wafers 10, 12.

In other words, the wafers 10, 12 start at 0 (zero) degrees when the wafers 10, 12 are aligned notch to notch. One of the wafers 10, 12 (wafer 12 as shown in FIG. 1) is then rotated a predetermined amount (for example, 90 degrees) in the wafer stacking apparatus at the instruction of the Alignment Program. Since the wafer 12 has not been rotated a full 360 degrees (i.e., one full rotation) with respect to wafer 10, the process loops back and the number of good die-to-good die combinations are counted, as indicated by block 42 (optionally, the number of bad die-to-bad die combinations may also be counted as indicated by block 54). Again, wafer 12 is then rotated a predetermined amount (for example, 90 degrees) in the wafer stacking apparatus at the instruction of the Alignment Program. The process continues with the rotation of wafer 12 in increments (again for example, 90 degrees) and counting of the number of good die-to-good die combinations (and optionally, number of bad die-to-bad die combinations) until the wafer 12 has been rotated a full 360 degrees (one full rotation), meaning the number of good die-to good die combinations (and optionally, number of bad die-to-bad die combinations) have been counted at every possible orientation of the wafers 10, 12, given the geometry of the die 14 on the wafers 10, 12. Once the wafer 12 has been rotated a full 360 degrees, the wafer 12 is back to its original 0 degree position with respect to wafer 10.

Once it is determined in block 46 that the wafer has been rotated 360 degrees, the Alignment Program chooses the relative orientation of the wafers 10, 12 (that is, the orientation of wafer 10 with respect to the orientation of wafer 12) with the maximum number of good die-to-good die combinations, block 48. The process may also consider the number of bad die-to-bad die combinations, as counted in block 54, as a check on the process.

The Alignment Program then considers if another wafer is to be aligned, block 50. If so, the Alignment Program returns to align the wafers notch to notch, block 40, and continues until the another wafer has been aligned so as to maximize the number of good die-to-good die combinations. The method continues until all wafers in the wafer stack have been aligned to maximize the number of good die-to-good die combinations. If there are no more wafers to align, the Alignment Program of aligning wafers to maximize the number of good die-to-good die combinations is done, block 52.

Figure 4:
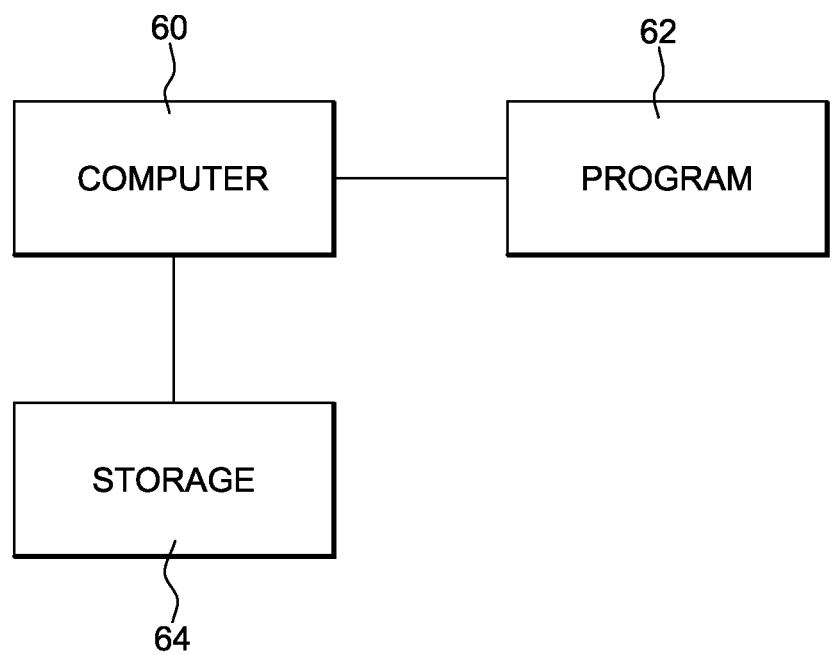
FIG. 4 is a block diagram illustrating an exemplary hardware environment of the present invention.

FIG. 4 is a block diagram that illustrates an exemplary hardware environment of the present invention. The present invention is typically implemented using a computer 60 comprised of microprocessor means, random access memory (RAM), read-only memory (ROM) and other components. The computer may be a personal computer, mainframe computer or other computing device. Resident in the computer 60, or peripheral to it, will be a storage device 64 of some type such as a hard disk drive, floppy disk drive, CD-ROM drive, tape drive or other storage device.

Generally speaking, the software implementation of the present invention, program 62 in FIG. 4, is tangibly embodied in a computer-readable medium such as one of the storage devices 64 mentioned above. The program 62 comprises instructions which, when read and executed by the microprocessor of the computer 60 causes the computer 60 to perform the steps necessary to execute the steps or elements of the present invention.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

We claim:

1. A process of forming three-dimensional (3D) die comprising the steps of:
   testing a plurality of wafers by a testing apparatus for die that pass (good die) or fail (bad die) predetermined test criteria;

placing a first tested wafer in proximity to a second tested wafer, wherein each of the wafers has a notch for alignment to another wafer;

aligning in a wafer stacking apparatus the first and second wafers so as to maximize the number of good die of the first wafer aligned with good die of the second wafer wherein the step of aligning comprises:

aligning by a processor device the first and second wafers so that the notches of both wafers are aligned;

counting by a processor device the number of good die of the first wafer aligned with good die of the second wafer;

rotating by a processor device the first or second wafer a predetermined amount;

counting by a processor device the number of good die of the first wafer aligned with good die of the second wafer;

repeating the rotating and counting steps until the rotated wafer has been rotated 360 degrees; and choosing by a processor device an orientation of the first and second wafers with the maximum number of good die of the first wafer aligned with good die of the second wafer;

bonding the first and second wafers; and dicing the stack of first and second wafers into 3D stacks of good die bonded to good die.

2. The process of claim 1 further comprising the steps, between aligning and bonding, of placing a third tested wafer on the second tested wafer and aligning in a wafer stacking apparatus the second and third wafers so as to maximize the number of good die of the first wafer aligned with good die of the second and third wafers.

3. The process of claim 2 further comprising placing a next tested wafer on a previous tested wafer and aligning in a wafer stacking apparatus the next and previous wafers so as to maximize the number of good die of the first wafer aligned with good die of all remaining wafers tested and aligned.

4. The process of claim 2 further comprising placing a next tested wafer on a previous tested wafer and aligning in a wafer stacking apparatus the next and previous wafers so as to maximize the number of contiguous good die of the wafers tested and aligned.

5. The process of claim 1 further comprising the steps, between aligning and bonding, of placing a third tested wafer on the second tested wafer and aligning in a wafer stacking apparatus the second and third wafers so as to maximize the number of good die of the second wafer aligned with good die of the third wafer.

6. The process of claim 1 wherein the predetermined amount is 90 degrees.

7. The process of claim 1 wherein the step of aligning in a wafer stacking apparatus includes to maximize the number of bad die of the first wafer aligned with bad die of the second wafer.

8. The process of claim 1 wherein between the steps of counting and rotating, further comprising the step of counting by a processor device the number of bad die of the first wafer aligned with bad die of the second wafer and between the steps of counting and repeating, further comprising the step of counting by a processor device the number of bad die of the first wafer aligned with bad die of the second wafer.

9. A computer program product for forming three-dimensional (3D) die, the computer program product comprising:

a nontransitory computer readable storage medium having computer readable program code embodied therewith, the computer readable program code comprising:

computer readable program code configured to test a plurality of wafers for die that pass (good die) or fail (bad die) predetermined test criteria;

computer readable program code configured to place a first tested wafer in proximity to a second tested wafer, wherein each of the wafers has a notch for alignment to another wafer;

computer readable program code configured to align the first and second wafers so as to maximize the number of good die of the first wafer aligned with good die of the second wafer, wherein the computer readable program code configured to align comprises:

computer readable program code configured to align the first and second wafers so that the notches of both wafers are aligned;

computer readable program code configured to count the number of good die of the first wafer aligned with good die of the second wafer;

computer readable program code configured to rotate the first or second wafer a predetermined amount;

computer readable program code configured to count the number of good die of the first wafer aligned with good die of the second wafer;

computer readable program code configured to repeat the rotating and counting steps until the rotated wafer has been rotated 360 degrees; and computer readable program code configured to choose an orientation of the first and second wafers with the maximum number of good die of the first wafer aligned with good die of the second wafer;

computer readable program code configured to bond the first and second wafers; and computer readable program code configured to dice the stack of first and second wafers into 3D stacks of good die bonded to good die.

10. The computer program product of claim 9 further comprising, between computer readable program code configured to align and computer readable program code configured to bond, of computer readable program code configured to place a third tested wafer on the second tested wafer and computer readable program code configured to align the second and third wafers so as to maximize the number of good die of the first wafer aligned with good die of the second and third wafers.

11. The computer program product of claim 10 further comprising computer readable program code configured to place a next tested wafer on a previous tested wafer and computer readable program code configured to align the next and previous wafers so as to maximize the number of good die of the first wafer aligned with good die of all remaining wafers tested and aligned.

12. The computer program product of claim 10 further comprising computer readable program code configured to place a next tested wafer on a previous tested wafer and computer readable program code configured to align the next and previous wafers so as to maximize the number of contiguous good die of the wafers tested and aligned.

13. The computer program product of claim 9 further comprising, between computer readable program code configured to align and computer readable program code configured to bond, of computer readable program code configured to place a third tested wafer on the second tested wafer and computer readable program code configured to align the second and third wafers so as to maximize the number of good die of the second wafer aligned with good die of the third wafer.

14. The computer program product of claim 9 wherein the predetermined amount is 90 degrees.

15. The computer program product of claim 9 wherein the computer readable program code configured to align includes to maximize the number of bad die of the first wafer aligned with bad die of the second wafer.

16. The computer program product of claim 9 wherein between computer readable program code configured to count and computer readable program code configured to rotate further comprising computer readable program code configured to count the number of bad die of the first wafer aligned with bad die of the second wafer and between computer readable program code configured to count and computer readable program code configured to repeat further comprising computer readable program code configured to count the number of bad die of the first wafer aligned with bad die of the second wafer.

\* \* \* \* \*